United States Patent
Hanley et al.

[11] Patent Number: 5,525,904
[45] Date of Patent: Jun. 11, 1996

[54] DETERMINATION OF ROCK CORE CHARACTERISTICS

[75] Inventors: Peter Hanley, Forest of Dean; Ian L. McDougall, Charlbury; David J. Hemsley, Drayton, all of England

[73] Assignee: Oxford Instruments, Ltd., Oxford, United Kingdom

[21] Appl. No.: 256,440

[22] PCT Filed: Jan. 12, 1993

[86] PCT No.: PCT/GB93/00050

§ 371 Date: Sep. 23, 1994

§ 102(e) Date: Sep. 23, 1994

[87] PCT Pub. No.: WO93/14413

PCT Pub. Date: Jul. 22, 1993

[30] Foreign Application Priority Data

Jan. 13, 1992 [GB] United Kingdom ............... 9200604
Mar. 19, 1992 [GB] United Kingdom ............... 9206014

[51] Int. Cl.$^6$ ............................................. G01V 3/00
[52] U.S. Cl. .................... 324/300; 324/303; 324/318; 324/319; 324/322
[58] Field of Search .................... 324/300, 303, 324/306, 318, 319, 322

[56] References Cited

U.S. PATENT DOCUMENTS 4,291,271  9/1981  Lauffer .
4,354,499  10/1982  Damadian ...................... 324/309 X
4,480,227  10/1984  Brown .
4,564,811  1/1986  Walker .
4,701,705  10/1987  Rollwitz .
4,885,540  12/1989  Snoddy et al. .
4,953,555  9/1990  Leupold et al. .
5,315,276  5/1994  Huson ............................ 324/319 X

FOREIGN PATENT DOCUMENTS 0170318  2/1986  European Pat. Off. .

OTHER PUBLICATIONS

IEEE Transactions On Magnetics, vol. 22, No. 5, Sep. 1, 1986, New York, pp. 1078–1080.

Primary Examiner—Sandra L. O'Shea
Assistant Examiner—Mack Haynes

[57] ABSTRACT

An apparatus for monitoring characteristics of rock cores using NMR. The apparatus is provided with a clad permanent magnet for generating a magnetic field having a saddle profile. The magnetic field is sufficiently uniform within a working volume to enable an NMR experiment to be performed. Rock cores are conveyed along a path about which the magnet is arranged. The cores pass through the working volume of the magnetic field orthogonally to the saddle profile of the magnetic field. An NMR experiment to monitor oil bearing rock characteristics, such as porosity is carried out on a portion of the rock core within the working volume.

6 Claims, 7 Drawing Sheets

DETERMINATION OF ROCK CORE CHARACTERISTICS

BACKGROUND OF THE INVENTION

1. Field of the Invention

It is well known that oil bearing rock characteristics such as porosity can be monitored by making use of nuclear magnetic resonance (NMR) techniques. Conventionally, test samples of rock cores from the well head are extracted and then sent to a remote laboratory for analysis. However, this is time consuming and there is a risk of damage to the rock core before it is analysed. Consequently, it has been proposed to carry out NMR analysis on rock cores at the well site. An example of apparatus of this type is described in U.S. Pat. No. 4,885,540. In this case, rock core samples are placed in individual troughs and fed by conveying rollers between the poles of an electromagnet and through a rf coil. The coil is pulsed in a conventional manner and used as a receiving coil to perform various conventional NMR analyses on the rock core samples.

2. Description of the Related Art

A number of problems arise with this known approach. One particular problem is that large fringe fields are generated by the magnet which is particularly undesirable when the apparatus is being used at the well head site. In this situation, there will tend to be large bodies of iron close to the equipment which experience the fringe field and as a result significantly reduce the uniformity of the field in the working region while there will also be sensitive instrumentation nearby which is affected by the fringe field.

Another problem which arises with the conventional approach is that the NMR analysis is carried out on the full cross-section of the rock cores which can lead to erroneous results due to the likelihood of damage to the surface areas.

SUMMARY OF THE INVENTION

In accordance with the present invention, apparatus for monitoring characteristics of rock cores comprises a clad permanent magnet for generating a magnetic field within a working volume which is sufficiently uniform to enable a NMR experiment to be performed; means for conveying rock cores along a path about which the magnet is arranged, the cores passing through the working volume of the magnetic field; and means for carrying out a NMR experiment on the portion of the rock core in the working volume.

In this new and improved approach, we have solved the problem of fringe field and provided apparatus which is capable of analysing small, central portions of the rock cores and which avoids the damaged outer regions.

Clad, permanent magnet structures for magnetic resonance imaging have been previously described in the art. The most compact and economical in materials usage are those described by E. Potenziani and H. A. Leupold (IEEE Transactions on Magnetics Mag-22, 1078–1080, 1986) which make use of "cladding magnets" to oppose the magnetomotive force (mmf) around the outside of the structure. This has the effect of preventing flux leakage so as to most effectively use the permanent magnet material and obtain good field uniformity in the working volume. These previous constructions, however have not been applied in the field of the present invention, namely rock core analysis, and it has certainly not been recognised that clad permanent magnets can provide both the advantages of small fringe field and the ability to achieve NMR analysis on central core regions.

In one example, the magnet has a box shape and this is particularly advantageous since it is possible to generate a magnetic field profile within the core of the magnet which has a saddle region extending along the magnet axis in the direction in which rock cores are conveyed, this saddle region being alignable with the surface of the rock cores and thus enabling the NMR to be performed on the central region of the rock core.

In other examples, the magnet may have a U or C-shape. In this case, the bight of the U may include a permanent magnet which generates 6a magnetic field whose flux passes through a working volume defined between the arms of the U, and wherein the dimensions of the assembly are chosen such that:

$$\frac{L_g}{L_m} = \frac{B_r}{2B_g} \qquad (1)$$

where:

$L_b$ is the length of the gap between the arms, $L_m$ is the length of the permanent magnet, $B_r$ is the remnant field of the permanent magnet, and $B_g$ is the field in the gap.

The following mathematical analysis illustrates the derivation of the formula set out above for minimizing the volume of magnet material.

Definitions

| Units: | | |
|---|---|---|
| Magnetic field, | H Oersteds | $H_c$ coercive force |
| Flux density, | B Gauss | $B_r$ remnant field |
| Magnetisation | M Gauss | |
| Length | L centimetres | |
| Area | A square centimetres | |
| Magnetomotive-force | $F = \int HdL$ oersted-cm | |
| Flux | $\phi = \int BdA$ Maxwells | |
| Subscripts: | | |
| m | magnet | |
| g | gap | |
| i | iron | |

Basic equations:

Flux continuity $B_g A_g = B_m A_m$

In practice we must allow for flux leakage. The cladding technique should minimise this but useful access to the field region will cause some leakage. We allow for this writing:

$B_g A_g = e B_m A_m$ where $0 < e \leq 1$.

For a "U-shaped magnet" e might be 0.5.

Formulae can be found in the literature for estimating leakage, alternatively, comparison of finite-element calculations with the analysis below will derive the leakage for the geometries of interest.

Ampere's Law

In the absence of electric currents the mmf round a circuit sums to zero. i.e.

$$H_m L_m + H_i L_i = -H_g L_g$$

However if the material of the arms (eg iron) is not saturated, so that B >> H, we can ignore the mmf in the iron: the iron acts as a short circuit to mmf.

Inside the permanent magnet $$B_m = H_m + M$$

For a "hard" material (NdFeB, SmCo etc)

$$M = \text{constant} = B_r (|H_m| < h_c)$$

Combining this with Ampere's Law gives:

$$B_m = B_r - H_g L_g / L_m$$

For the gap $B_g = H_g$ Therefore from flux continuity $$B_g \left(1 + e \frac{A_m L_g}{A_g L_m}\right) = e \frac{A_m}{A_g} B_r$$

which enables us to design the system.

Optimisation

In a large magnet we will wish to minimise the volume of the permanent magnet. Traditionally this has been done by constructing a "load line" on the demagnetisation curve through the maximum energypoint. The use of hard magnetic materials allows a more illuminating approach.

We can re-write the above equation in terms of the volumes, V=AL, of the magnets and the gap, and also in terms of the ratio, x, of magnet length to gap length. Then $$V_m = \frac{V_g}{e(x B_r / B_g - x^2)}$$

Whence to minimise the volume of magnet material $$\frac{L_g}{L_m} = \frac{B_r}{2 B_g}$$

For typical bonded NdFeB magnet material, $B_r = 6800$ gauss and $H_c = 5800$ Oersted. For a 1.5 kgauss magnet therefore, the magnet should be about half the gap length. Note that this analysis is independent of the particular geometry.

Cladding magnets

The purpose of the cladding magnets is to "push" the flux where we want it to go by producing an opposing magnetomotive force. They do not in themselves produce any field in the working volume, but inhibit flux leakage and so enhance both the field strength and field uniformity produced by the main magnet and pole piece assembly.

Within the cladding magnet, B=0 so that $H_m = H_c$

In the gap, the mmf to be opposed is $H_g L_g = B_g L_g$ so that the thickness of cladding magnet is $$L_{clad} = L_g B_g / H_c$$

In one example of a U-shaped magnet the permanent magnet generates a magnetic field whose magnetisation direction extends along the bight of the U, circulates through the arms of U and across the gap between the arms.

In another example, the permanent magnet which generates a magnetic field whose magnetisation direction is substantially parallel with the arms of the U, the magnetic flux passing into a working volume defined within the gap between the arms of the U and returning via the arms.

This is a new configuration of a U or C magnet which has particular advantages.

Although it is not essential, in the preferred arrangement, a ferromagnetic pole piece is provided along the face of the permanent magnet which faces towards the working volume. The use of a pole piece helps to level the non-uniformity within the working volume due to variations in the permanent magnet.

The pole piece could have a planar form but is preferably shaped, for example having a triangular cross-section, so as to provide even more control of the field uniformity by adjusting the permeance of different flux paths through the gap.

Each of the U-shaped magnets described so far will suffer from some end-effects due to flux leakage. This can be reduced by providing correction magnets at the ends of the magnet assembly, the direction of magnetisation of the correction magnets being substantially parallel with the direction of magnetisation of the permanent magnet of the assembly.

The means for conveying rock cores can be of any suitable form, for example of the type described in U.S. Pat. No. 4,885,540, conveyor belts or the like.

BRIEF DESCRIPTION OF THE DRAWINGS

Some examples of apparatus according to the invention will now be described with reference to the accompanying drawings, in which.

DESCRIPTION OF THE PREFERRED EMBODIMENTS

Figure 1:
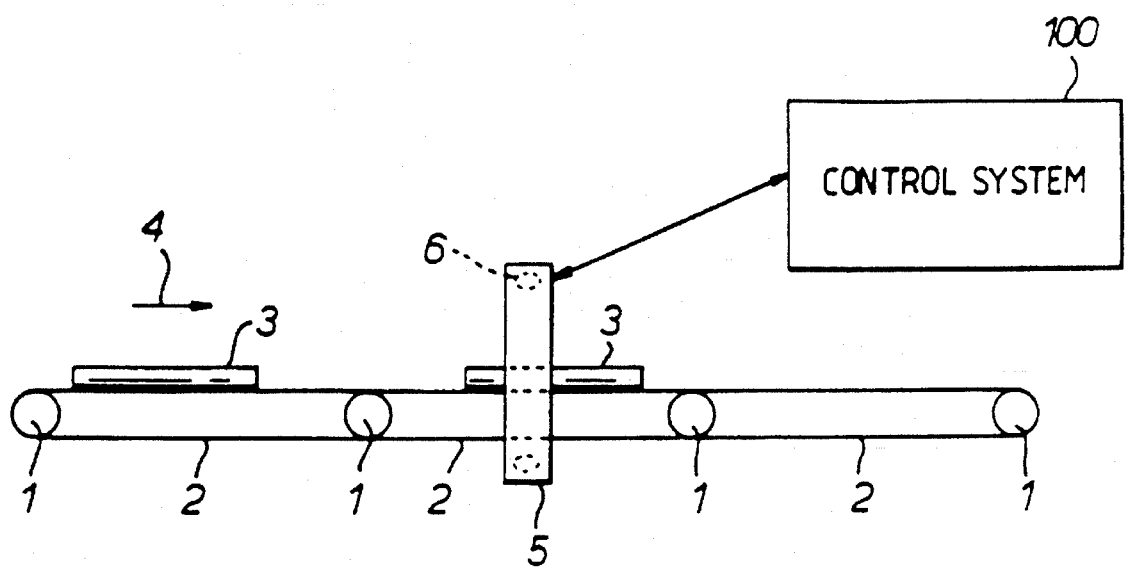
FIG. 1 is a schematic view of an example of the apparatus.

Reference will now be made in detail to the present preferred embodiments of the present invention, examples of which are illustrated in the accompanying drawings, wherein like reference numerals refer to like elements throughout.

FIG. 1 illustrates very schematically the apparatus for handling rock cores at the well head. A set of rollers 1 are provided about which are entrained sets of conveyor belts 2 which are moved to convey rock cores 3 in the direction of the arrow 4. Each rock core has a diameter of 2 to 3.5 inches. A permanent magnet 5 is positioned about the central conveyor 2 so as to generate a magnetic field in a working volume (to be described below) through which the rock cores 3 are conveyed. A typical field strength for the magnetic field within the working volume is 470 gauss with a stability of 10 ppm over a duration of one hour. The homogeneity of the working volume is about 100 ppm using RT shims. A cylindrical former 6 carries gradient coils (not shown) to generate a gradient parallel to the main magnetic field direction (which is vertical as shown in FIG. 1), the maximum strength of the gradient coils being 20 gauss/cm. The system is controlled by a control system 100 which controls, inter alia, the pulsing of gradient fields, the shimming of the main field, the transmission and reception of rf pulses and the processing of the NMR data. The control system is closely based on the QP20 NMR Analyser manufactured and sold by Oxford Instruments and so will not be described in detail.

In order to carry out the necessary NMR experiment, an rf probe or coil is mounted on the former 6 coaxial with the central axis of the rock cores 3 which are passing along the conveyors 2. The coil acts both as a transmitting coil and a receiving coil.

Figure 2:
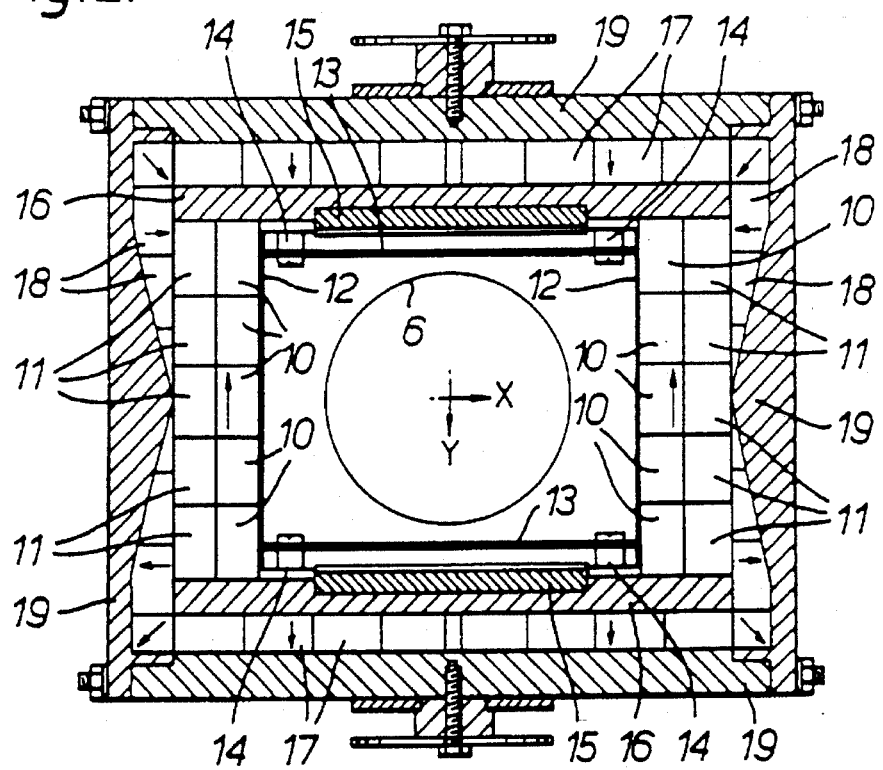
FIGS. 2-5 are a transverse section through a midplane, a part longitudinal section, a transverse section, and a longitudinal section respectively of a box magnet for use in the apparatus shown in FIG. 1.

The magnet 5 may take a variety of forms but in the preferred arrangement is a box magnet as shown in FIGS. 2 to 5. The box magnet comprises two layers of permanent magnets 10, 11 mounted on opposed sides of the magnet the magnetisation direction of each magnet 10, 11 being in the -Y direction as seen in FIG. 2. The magnets 10 are bounded on their internal surfaces by respective side pieces 12. A pair of shim coil carriers 13, which carry main field shim coils in use, extend between the side pieces 12 and are supported by sets of spacing screws 14. Iron shim pieces 15 are also positioned behind the shim coil carriers 13.

A pair of mild steel pole pieces 16 extend between the sets of permanent magnets 10, 11 and define with the magnets 10, 11 the main box magnet.

Each pole piece 16 carries a set of permanent cladding magnets 17, the magnetisation direction of some of which are shown in the drawings. Further, shaped cladding magnets 18 are provided on the surfaces of the magnets 11. The cladding magnets are held in place by aluminium alloy end plates 19.

The longitudinal ends of the magnet are closed by respective aluminium alloy end cladding carriers 20.

Figure 4:
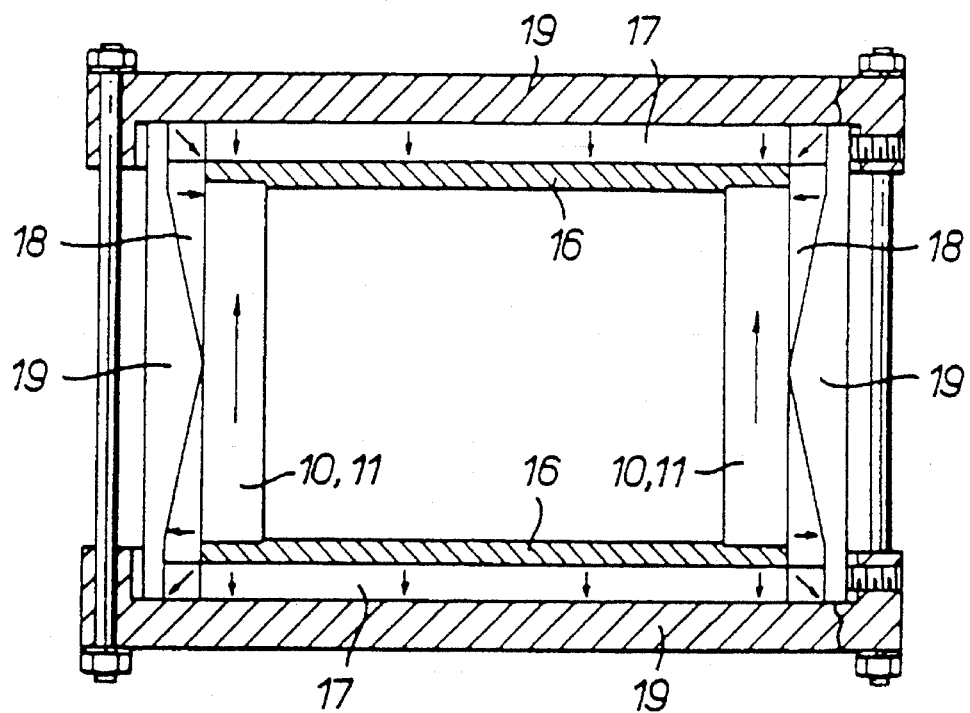
Figure 5:
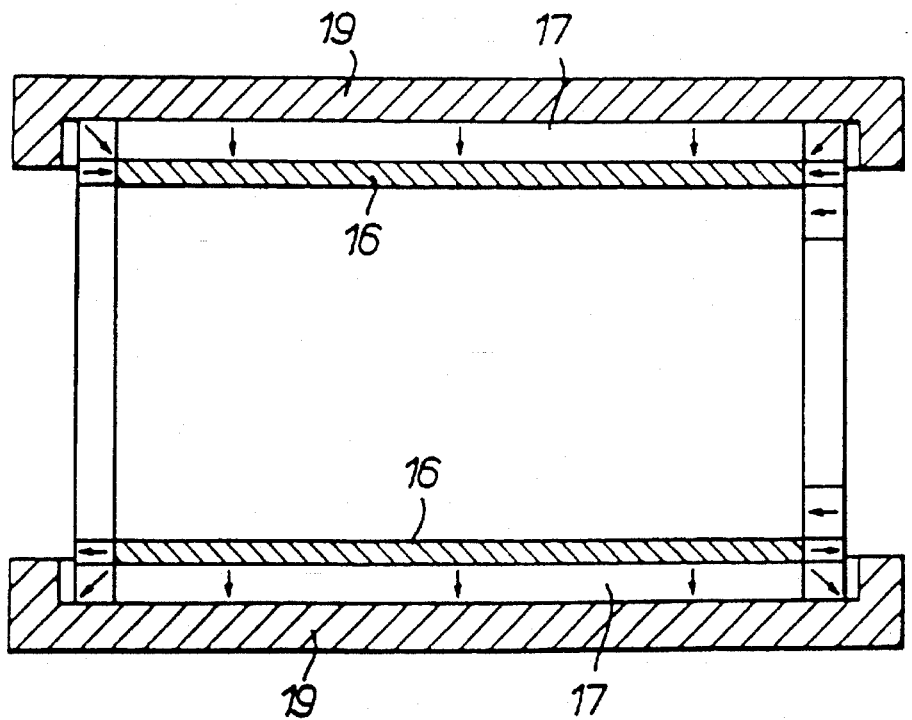

FIGS. 4 and 5 illustrate the box magnet in a more schematic form.

Figure 3:
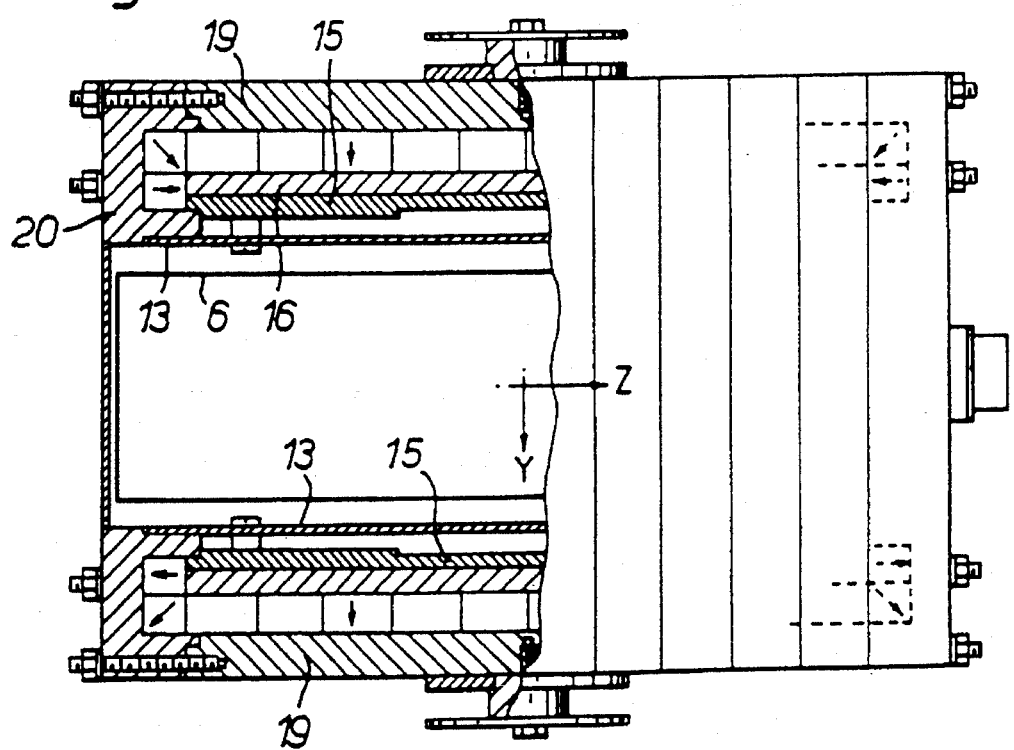
Figure 6:
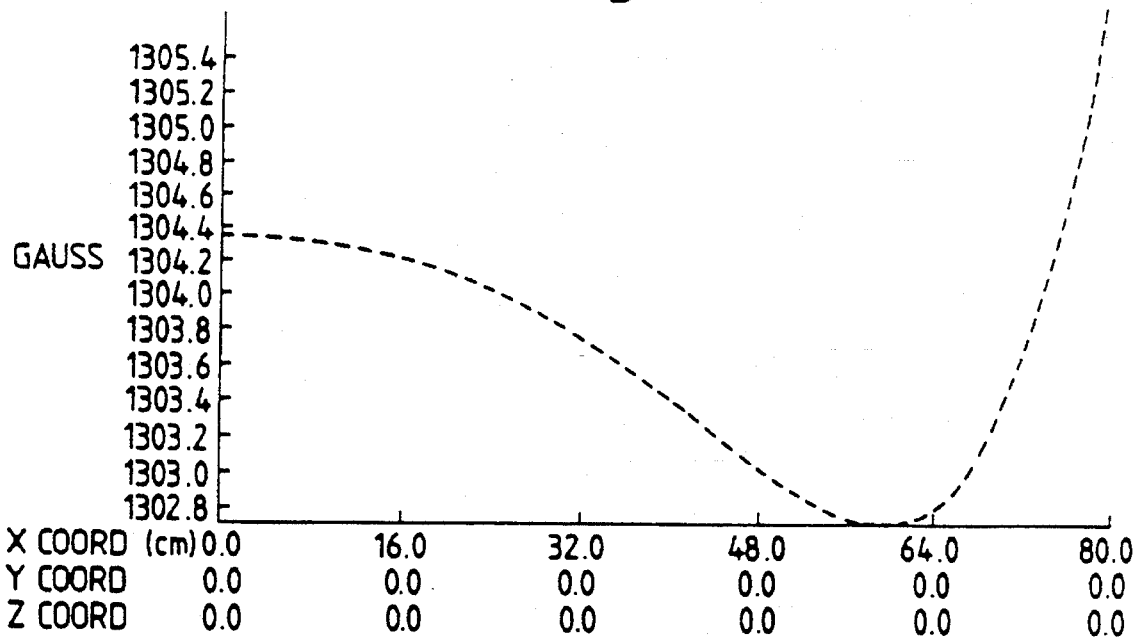
FIGS. 6 and 7 illustrate graphically the variation in field profile within the box magnet shown in FIGS. 2 to 5.

FIG. 6 illustrates the variation of the Y component of the field in the Y-Z plane with the origin at the centre of the working region (as shown in FIGS. 2 and 3) and it will be seen that the magnetic field variation exhibits a saddle at a radius of about 12 cm from the original.

Figure 7:
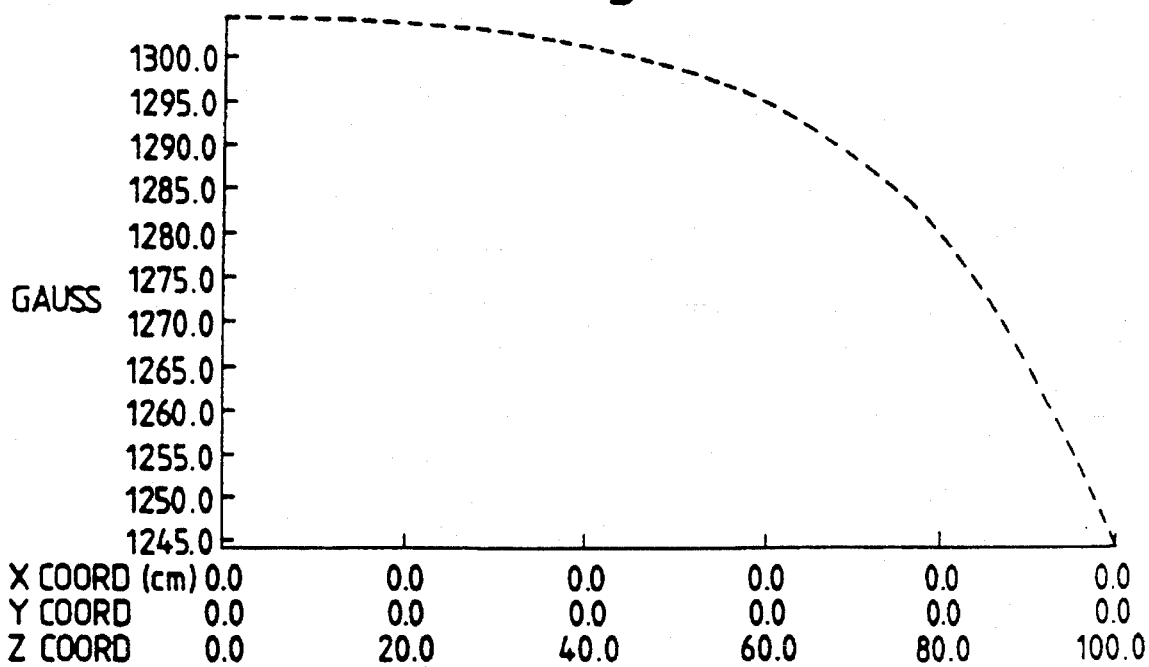

FIG. 7 illustrates the field variation in the X-Y plane.

Figure 8A:
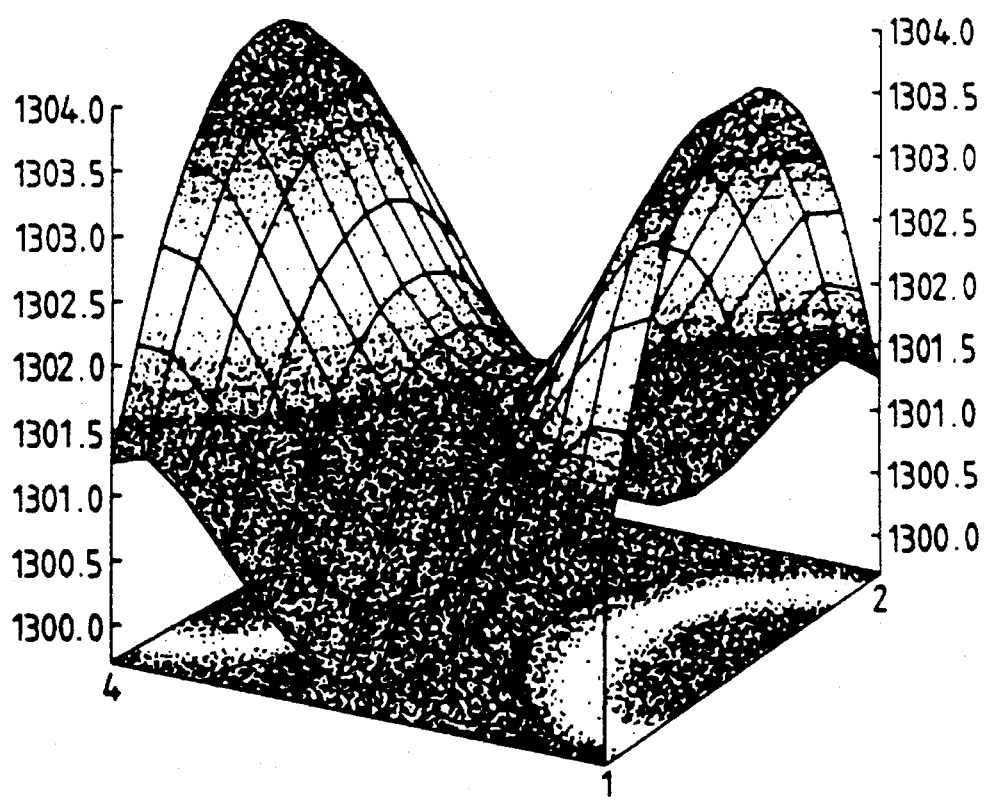
FIGS. 8A and 8B are three dimensional plots showing the magnetic field profile in the Y direction within the box magnet of FIGS. 2 to 5.
Figure 8B:
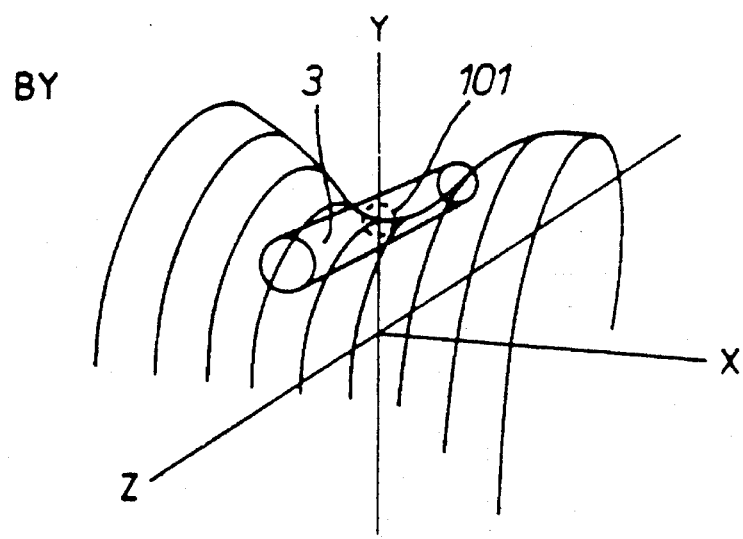

The saddle form of the field can be seen more clearly in FIG. 8A. In operation, a rock core would lie as shown in FIG. 8B relative to the field profile, the working volume being shown at 101.

In the case of the box magnet shown in FIGS. 2–5, the generation of the saddle form for the magnetic field will localise to some extent the nuclei which respond to the NMR experiment towards the middle of the rock core. This therefore overcomes some of the problems of the prior art by avoiding the potentially damaged outer surface of the core. Further localisation can be achieved by using conventional topical magnet resonance (t.m.r.) as described, for example, in the text book "Nuclear Magnetic Resonance Imaging in Medicine and Biology" by Peter G. Morris, section 3.2.2. The pulse sequences used can be of conventional form as carried out, for example, on the QP20 analyser manufactured by Oxford Instruments Limited. Other suitable pulse sequences are described in U.S. Pat. No. 4,885,540 and in any event will be obvious to those skilled in the art.

FIGS. 9–12 illustrate a number of alternative constructions for the magnet 5.

Figures 9, 10:
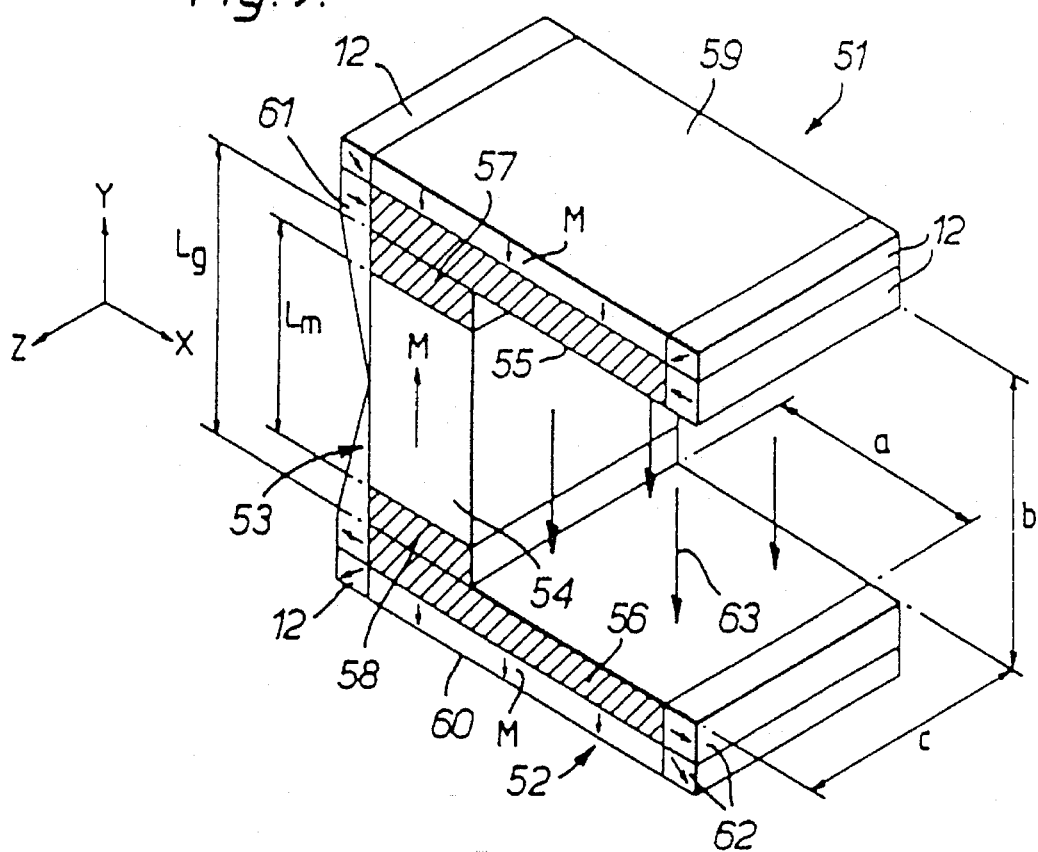
FIGS. 9 and 10 are perspective views of two examples of a U-shaped magnet for use in the apparatus shown in FIG. 1.
Figure 11:
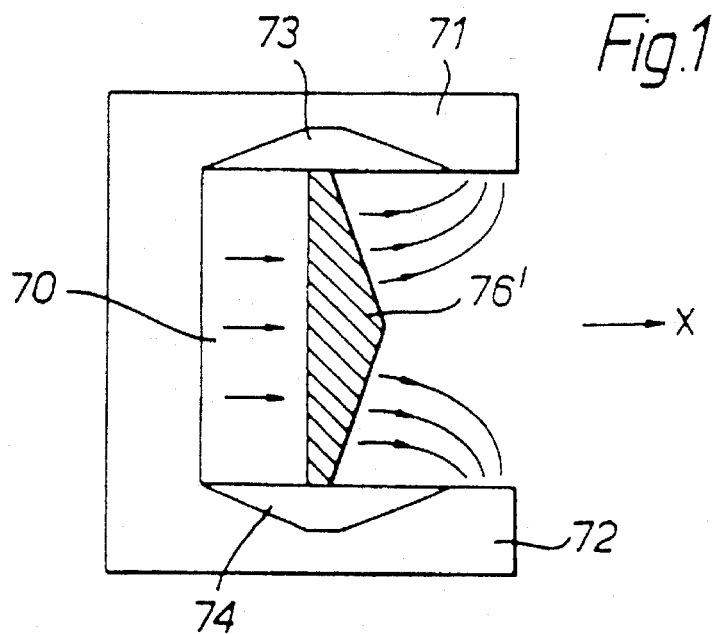
FIG. 11 is a side elevation of a modified form of the FIG. 10 example.

The magnet shown in FIG. 9 has a generally U or C shape with a pair of arms 51, 52 connected to a bight portion 53. The bight portion 53 comprises a permanent magnet 54 which may be monolithic or made up of smaller blocks of permanent magnet arranged so that the direction of magnetisation M is orthogonal to the planes of the two arms 51, 52. Each arm 51, 52 is formed by a planar iron piece 55, 56 and is connected to the permanent magnet 54 by further iron pieces 57, 58.

In order to find the magnetic flux due to the magnet 54 within the gap defined between the arms 51, 52, each arm is provided on its outer surface with a cladding magnet 59, 60 while the outer surface of the bight portion 53 is also provided with a cladding magnet 61 having a tapered form as described in more detail in the paper mentioned above. Additional cladding magnet sections 62 are provided about the assembly to provide as full cladding as possible while leaving the opening into the gap. As can be seen in FIG. 9, the main magnetic flux within the gap passes through the working volume, which is normally spherical, is in the direction 63.

In this example, the cladding magnets prevent flux leakage in the negative X, and both Y directions. Some cladding is provided in the positive X direction, and although not shown in this diagram, similar partial cladding could be applied in both Z directions. However, flux leakage occurs in the positive X direction and in both Z directions. The effect of this on the field uniformity can be obviated either by making the dimensions 'a' and 'c' of the magnet much greater than the size of the volume of interest, or by applying a correction for the finite length, as will be described below.

The volume of the magnetic material forming the permanent magnet 54 is chosen to satisfy equation I above and as can be seen in FIG. 9, on the basis of the values for $B_r$ and $H_c$ mentioned above, for a 1.5 kgauss magnet 54, the magnet has a length $L_m$ which is about ½ the gap length $L_g$.

FIG. 10 illustrates another U-shaped magnet known as a "single-sided" magnet. This is formed by a permanent magnet 70 extending between arms 71, 72. Cladding magnets 73, 74 are provided within the arms 71, 72 and the whole is surrounded by an iron casing 75. A planar pole piece 76 of iron is positioned against the face of the permanent magnet 70 facing towards the gap between the arms 71, 72. The magnetic flux in this case passes from the magnet 70 directly into the gap between the arms 71, 72 and through the working volume and then outwardly into the arms 71, 72 before returning to the magnet 70. This configuration is particularly advantageous when the volume to be examined is a relatively flat shape lying parallel to the YZ plane.

In the FIG. 10 example, the pole piece 76 is shown flat or planar. Some improvement in the uniformity of the field within the gap can be achieved by shaping the pole piece as shown schematically at 76' in FIG. 11.

Some flux leakage in both the FIG. 9 and FIG. 10 examples will occur in the positive and negative Z directions. This can be reduced by adding correction pieces in the form of additional permanent magnets at the ends of the magnet assembly. This is shown schematically in FIG. 12 for the FIG. 10 example in which cuboid correction magnets 77, 78 are positioned alongside each end of the magnet assembly shown in FIG. 10. In the case of the FIG. 9 example, cuboid magnets would be placed alongside each end of the arms 71, 72 (four such magnets in all).

Figure 12:
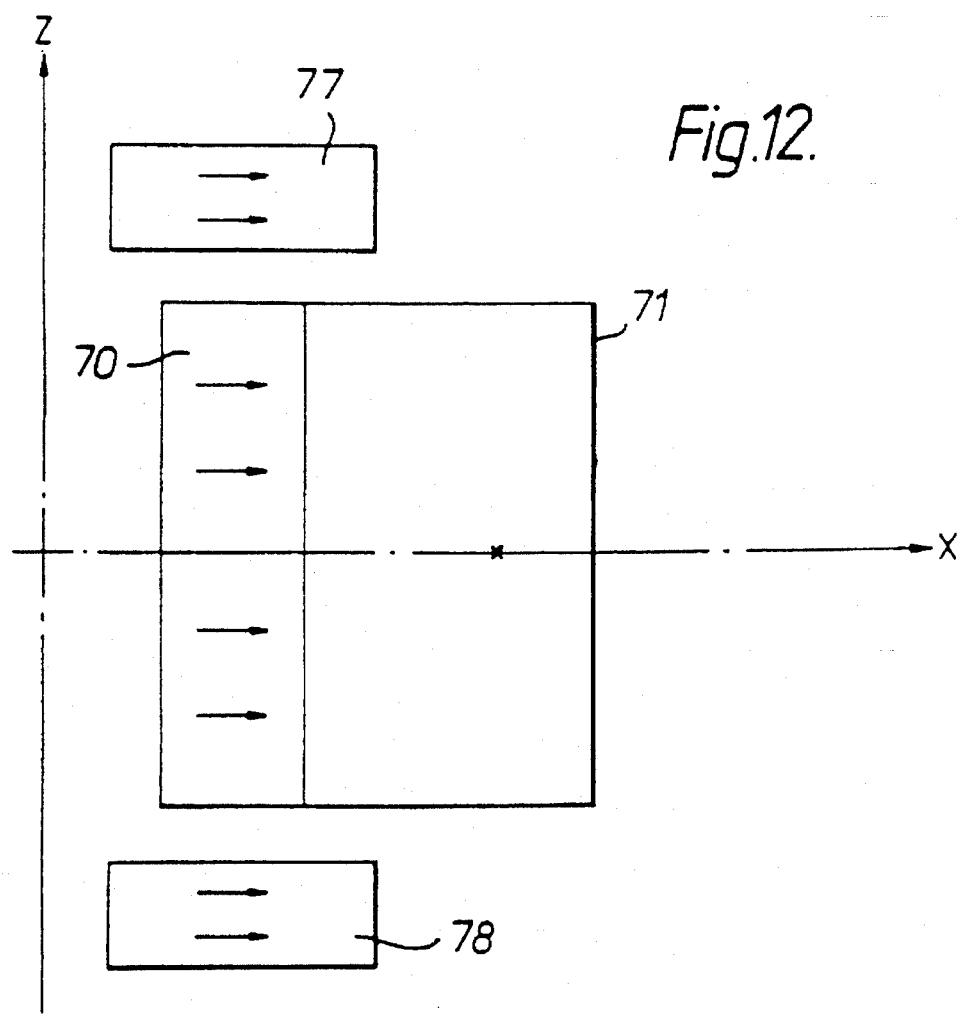
FIG. 12 is a schematic plan of a further modified version of the FIG. 10 example.

To illustrate the effect of the correction pieces in the FIG. 12 example, consider the field at a point near the region of interest as described by a Taylor series:

$$B(x+\delta) = B(x) + \delta \frac{\partial B}{\partial x} + \frac{\delta^2}{2!} \frac{\partial^2 B}{\partial x^2} + \ldots$$

The objective is to position the correction pieces such that their contributions to the field derivatives $$\frac{\partial Bx}{\partial x}, \frac{\partial^2 Bx}{\partial x^2}, \frac{\partial^2 Bx}{\partial y^2}$$

are equal and opposite to those of the main field producing slab. As in the case of thick solenoids, analytic expressions do not exist for the field derivatives and numerical techniques must be used. However, the use of "hard" magnetic materials means that the magnetisations are substantially uniform throughout the magnetised material and finite-element calculations are not always necessary. Instead, the magnetised material can be conveniently modelled by current sheets, and the resulting magnetic field and its derivatives at the point of interest rapidly calculated, so as to allow an iterative design process.

Some examples of magnet assemblies are described in the following Tables, in which:

Table 1 shows the field derivatives of a field producing slab.

Table 2 shows the contribution of one of a pair of correction pieces.

Table 3 shows the derivatives of the complete system of slab and two correction pieces.

Table 4 presents a field plot of this system, and FIG. 12 shows these field profiles graphically, together with the dimensions of the system.

TABLE 1

FIELD DERIVATIVES w.r.t. X range 5.000E+000
at X = 6.000E+001, Y = 0.000E+000, Z = 0.000E+000

| gauss | centimetres degrees | | | |
|---|---|---|---|---|
| order | Bx | By | Bz | Bmod |
| 0 | 3.622E+002 | 0.000E+000 | 0.000E+000 | 3.622E+002 |
| 1 | −1.400E+001 | 0.000E+000 | 0.000E+000 | −1.400E+001 |
| 2 | 3.742E−001 | 0.000E+000 | 0.000E+000 | 3.742E−001 |
| 3 | 3.917E−002 | 0.000E+000 | 0.000E+000 | 3.917E−002 |
| 4 | −1.025E−002 | 0.000E+000 | 0.000E+000 | −1.025E−002 |
| dB4 | −1.668E−002 | 0.000E+000 | 0.000E+000 | −1.668E−002 |
| dBtotal | −3.622E+002 | 0.000E+000 | 0.000E+000 | −3.375E+001 |

TABLE 2

FIELD DERIVATIVES w.r.t. X range 5.000E+000
at X = 5.940E+001, Y = −4.000E+000, Z = 0.000E+000

| gauss | centimetres degrees | | | |
|---|---|---|---|---|
| order | Bx | By | Bz | Bmod |
| 0 | −7.646E+001 | −1.184E+002 | 0.000E+000 | 1.410E+002 |
| 1 | 7.005E+000 | −7.090E−001 | 0.000E+000 | −3.204E+000 |
| 2 | −1.831E−001 | 4.899E−001 | 0.000E+000 | −3.340E−002 |
| 3 | −3.599E−002 | −3.650E−002 | 0.000E+000 | 1.348E−002 |
| 4 | 5.889E−003 | −2.200E−003 | 0.000E+000 | −7.750E−004 |
| dB4 | 9.585E−003 | −3.581E−003 | 0.000E+000 | −1.261E−003 |
| dBtotal | 1.686E+001 | −3.402E−001 | 0.000E+000 | −8.081E+000 |

TABLE 3

FIELD DERIVATIVES w.r.t. X range 5.000E+000
at X = 6.000E+001, Y = 0.000E+000, Z = 0.000E+000

| gauss | centimetres degrees | | | |
|---|---|---|---|---|
| order | Bx | By | Bz | Bmod |
| 0 | 2.092E+002 | 1.421E−014 | 0.000E+000 | 2.092E+002 |
| 1 | 1.025E−002 | −4.500E−015 | 0.000E+000 | 1.025E−002 |
| 2 | 8.031E−003 | −3.657E−014 | 0.000E+000 | 8.031E−003 |
| 3 | −3.281E−002 | 6.366E−015 | 0.000E+000 | −3.281E−002 |
| 4 | 1.550E−003 | 7.130E−014 | 0.000E+000 | 1.550E−003 |
| dB4 | 2.523E−003 | 1.161E−013 | 0.000E+000 | 2.523E−003 |

TABLE 3-continued

| | | | | |
|---|---|---|---|---|
| dBtotal | −2.092E+002 | 7.105E−015 | 0.000E+000 | −3.221E−002 |

FIELD DERIVATIVES w.r.t. Y range 5.000E+000
at X = 6.000E+001, Y = 0.000E+000, Z = 0.000E+000

| gauss | | centimetres degrees | | |
|---|---|---|---|---|
| order | Bx | By | Bz | Bmod |
| 0 | 2.092E+002 | 1.421E−014 | 0.000E+000 | 2.092E+002 |
| 1 | −7.451E−010 | −1.101E−002 | 0.000E+000 | 0.000E+000 |
| 2 | −8.089E−003 | 0.000E+000 | 0.000E+000 | −8.092E−003 |
| 3 | 0.000E+000 | −3.368E−002 | 0.000E+000 | 0.000E+000 |
| 4 | 1.675E−003 | 0.000E+000 | 0.000E+000 | 1.700E−003 |
| dB4 | 2.726E−003 | 0.000E+000 | 0.000E+000 | 2.767E−003 |
| dBtotal | −2.255E−002 | −1.152E−001 | 0.000E+000 | −2.252E−002 |

TABLE 4

| FIELD PLOTS gauss centimetres degrees | | | | |
|---|---|---|---|---|
| X | Bx | By | Bz | Bmod |
| | | Z = 0.000E+000 Y = 0.000E+000 | | |
| 4.000E+001 | 2.300E+002 | −3.553E−015 | 0.000E+000 | 2.300E+002 |
| 4.500E+001 | 2.228E+002 | 1.954E−014 | 0.000E+000 | 2.228E+002 |
| 5.000E+001 | 2.145E+002 | −1.776E−014 | 0.000E+000 | 2.145E+002 |
| 5.500E+001 | 2.100E+002 | 1.066E−014 | 0.000E+000 | 2.100E+002 |
| 6.000E+001 | 2.092E+002 | 1.421E−014 | 0.000E+000 | 2.092E+002 |
| 6.500E+001 | 2.088E+002 | 1.066E−014 | 0.000E+000 | 2.088E+002 |
| 7.000E+001 | 2.054E+002 | 1.066E−014 | 0.000E+000 | 2.054E+002 |
| 7.500E+001 | 1.983E+002 | −4.619E−014 | 0.000E+000 | 1.983E+002 |
| | | Y = 5.000E+000 | | |
| 4.000E+001 | 2.333E+002 | 5.031E+000 | 0.000E+000 | 2.333E+002 |
| 4.500E+001 | 2.235E+002 | 9.948E+000 | 0.000E+000 | 2.237E+002 |
| 5.000E+001 | 2.121E+002 | 7.428E+000 | 0.000E+000 | 2.122E+002 |
| 5.500E+001 | 2.078E+002 | 1.692E+000 | 0.000E+000 | 2.078E+002 |
| 6.000E+001 | 2.092E+002 | −7.773E−001 | 0.000E+000 | 2.092E+002 |
| 6.500E+001 | 2.104E+002 | 1.197E+000 | 0.000E+000 | 2.104E+002 |
| 7.000E+001 | 2.075E+002 | 5.261E+000 | 0.000E+000 | 2.076E+002 |
| 7.500E+001 | 1.999E+002 | 9.133E+000 | 0.000E+000 | 2.001E+002 |
| | | Y = 1.000E+001 | | |
| 4.000E+001 | 2.487E+002 | 1.183E+001 | 0.000E+000 | 2.489E+002 |
| 4.500E+001 | 2.256E+002 | 2.980E+001 | 0.000E+000 | 2.276E+002 |
| 5.000E+001 | 2.005E+002 | 1.830E+001 | 0.000E+000 | 2.013E+002 |
| 5.500E+001 | 1.990E+002 | −1.125E+000 | 0.000E+000 | 1.990E+002 |
| 6.000E+001 | 2.099E+002 | −6.589E+000 | 0.000E+000 | 2.100E+002 |
| 6.500E+001 | 2.167E+002 | 4.110E−001 | 0.000E+000 | 2.167E+002 |
| 7.000E+001 | 2.145E+002 | 1.096E+001 | 0.000E+000 | 2.148E+002 |
| 7.500E+001 | 2.051E+002 | 1.964E+001 | 0.000E+000 | 2.060E+002 |
| | | Y = 1.500E+001 | | |
| 4.000E+001 | 3.087E+002 | 2.314E+001 | @000E+000 | 3.096E+002 |
| 4.500E+001 | 2.273E+002 | 9.164E+001 | 0.000E+000 | 2.451E+002 |
| 5.000E+001 | 1.565E+002 | 3.503E+001 | 0.000E+000 | 1.604E+002 |
| 5.500E+001 | 1.780E+002 | −2.300E+001 | 0.000E+000 | 1.795E+002 |
| 6.000E+001 | 2.173E+002 | −2.563E+001 | 0.000E+000 | 2.188E+002 |
| 6.500E+001 | 2.333E+002 | −3.035E+000 | 0.000E+000 | 2.333E+002 |
| 7.000E+001 | 2.287E+002 | 1.922E+001 | 0.000E+000 | 2.295E+002 |
| 7.500E+001 | 2.140E+002 | 3.378E+001 | 0.000E+000 | 2.166E+002 |
| | | Y = 2.000E+001 | | |
| 4.000E+001 | 6.008E+002 | 4.305E+001 | 0.000E+000 | 6.023E+002 |
| 4.500E+001 | 1.768E+002 | 3.498E+002 | 0.000E+000 | 3.920E+002 |
| 5.000E+001 | −9.368E+000 | 2.107E+001 | 0.000E+000 | 2.306E+001 |
| 5.500E+001 | 1.532E+002 | −1.142E+002 | 0.000E+000 | 1.911E+002 |
| 6.000E+001 | 2.553E+002 | −6.609E+001 | 0.000E+000 | 2.638E+002 |
| 6.500E+001 | 2.707E+002 | −2.853E+000 | 0.000E+000 | 2.707E+002 |
| 7.000E+001 | 2.520E+002 | 3.625E+001 | 0.000E+000 | 2.546E+002 |
| 7.500E+001 | 2.256E+002 | 5.529E+001 | 0.000E+000 | 2.323E+002 |

We claim:

1. An apparatus for monitoring characteristics of rock cores comprising:

a clad permanent magnet for generating a magnetic field having a saddle profile, the magnetic field being sufficiently uniform within a working volume to enable a NMR experiment to be performed;

means for conveying rock cores along a path about which the magnet is arranged, the cores passing through the working volume of the magnetic field orthogonal to the saddle profile; and means for carrying out a NMR experiment on a portion of the rock core in the working volume.

2. An apparatus according to claim 1, wherein the magnet has a box shape.

3. An apparatus according to claim 2, wherein the magnet generates a magnetic field having constant field contours defining a saddle profile.

4. An apparatus according to claim 1, wherein the magnet has a U or C-shape.

5. An apparatus according to claim 4, wherein the dimensions of the magnet are chosen such that:

$$\frac{L_g}{L_m} = \frac{B_r}{2B_g}$$

where:

$L_b$ is the length of the gap between the arms, $L_m$ is the length of the permanent magnet, $B_r$ is the remnant field of the permanent magnet, and $B_g$ is the field in the gap.

6. An apparatus according to claim 1, wherein the means for conveying rock cores comprise conveyor belts.

* * * * *